(12) United States Patent
Liu et al.

(10) Patent No.: US 10,616,015 B2
(45) Date of Patent: Apr. 7, 2020

(54) SIGNAL PROCESSING SYSTEM AND METHOD, AND APPARATUS

(71) Applicant: HUAWEI TECHNOLOGIES CO., LTD., Shenzhen, Guangdong (CN)

(72) Inventors: Ling Liu, Wuhan (CN); Zhiyu Xiao, Chengdu (CN); Liangchuan Li, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 15/991,912

(22) Filed: May 29, 2018

(65) Prior Publication Data

US 2018/0278448 A1 Sep. 27, 2018

Related U.S. Application Data

(63) Continuation of application No. PCT/CN2015/095988, filed on Nov. 30, 2015.

(51) Int. Cl.
*H03M 13/00* (2006.01)
*H04L 27/01* (2006.01)
(Continued)

(52) U.S. Cl.
CPC ............ *H04L 27/01* (2013.01); *H03M 13/03* (2013.01); *H03M 13/2957* (2013.01);
(Continued)

(58) Field of Classification Search
CPC ..... H04L 27/01; H04L 1/0041; H04L 1/0045; H04L 25/03273; H04L 25/03286; H04L 25/067
See application file for complete search history.

(56) References Cited

U.S. PATENT DOCUMENTS 8,737,458 B2 * 5/2014 Eliaz .................. H04L 27/2628
375/230
2011/0188550 A1 8/2011 Wajcer et al.
(Continued)

FOREIGN PATENT DOCUMENTS

CN 102165705 A 8/2011
CN 102215189 A 10/2011
(Continued)

OTHER PUBLICATIONS

Mauri J et al:"An EM Approach to Carrier Phase Recovery in AWGN Channel", 2001 IEEE. pp. 2199-2203. XP10553707.
(Continued)

*Primary Examiner* — Samir W Rizk
(74) *Attorney, Agent, or Firm* — Fish & Richardson P.C.

(57) ABSTRACT

A signal processing system and method, and an apparatus are provided. A phase recovery apparatus may be used to: receive a feedback signal fed back by an information iteration apparatus, perform, based on the feedback signal, phase recovery on a signal output by an equalizer, and output a phase-recovered signal to a post filtering apparatus, so that the post filtering apparatus performs noise filtering on the phase-recovered signal, and outputs a noise-filtered signal to the information iteration apparatus. To be specific, the phase recovery may be performed, based on the signal fed back by the information iteration apparatus, on the signal output by the equalizer. Because output of the information iteration apparatus is more accurate in determining the signal, precision of the phase recovery can be improved, cycle skipping is reduced, and input signal quality of the post filtering apparatus is improved.

15 Claims, 4 Drawing Sheets

```
┌─ 501
│ A phase recovery apparatus receives a signal output by an equalizer and a
│ feedback signal fed back by an information iteration apparatus, where the
│ feedback signal is sequence detection information and/or error detection
│ information that are/is obtained when the information iteration apparatus
│ performs, in a soft value information iteration manner, sequence detection and
│ error detection on a noise-filtered signal output by a post filtering apparatus
└─
          │
          ▼ 502
┌─
│ Perform, based on the feedback signal, phase recovery on the signal output by
│ the equalizer, and output a phase-recovered signal to the post filtering
│ apparatus, so that the post filtering apparatus performs noise filtering on the
│ phase-recovered signal, and outputs the noise-filtered signal to the information
│ iteration apparatus
└─
```

(51) Int. Cl.
*H04L 25/03* (2006.01)
*H04L 25/06* (2006.01)
*H03M 13/03* (2006.01)
*H03M 13/29* (2006.01)
*H04L 1/00* (2006.01)

(52) U.S. Cl.
CPC .......... *H04L 1/0041* (2013.01); *H04L 1/0045* (2013.01); *H04L 25/03273* (2013.01); *H04L 25/03286* (2013.01); *H04L 25/067* (2013.01)

(56) References Cited

U.S. PATENT DOCUMENTS

| | | |
|---|---|---|
| 2011/0243561 A1 | 10/2011 | Li et al. |
| 2013/0343446 A1 | 12/2013 | Eliaz et al. |
| 2014/0099108 A1 | 4/2014 | Yu et al. |
| 2014/0177765 A1 | 6/2014 | Gotman et al. |
| 2014/0199076 A1 | 7/2014 | Yu et al. |
| 2014/0289589 A1 | 9/2014 | Jia et al. |
| 2014/0325319 A1 | 10/2014 | Cai et al. |
| 2014/0369398 A1 | 12/2014 | Yu et al. |
| 2015/0229405 A1 | 8/2015 | Yu et al. |
| 2015/0256293 A1 | 9/2015 | Eliaz et al. |
| 2017/0012802 A1 | 1/2017 | Li et al. |

FOREIGN PATENT DOCUMENTS

| | | |
|---|---|---|
| CN | 102394843 A | 3/2012 |
| CN | 103931151 A | 7/2014 |
| CN | 104025527 A | 9/2014 |
| CN | 104065451 A | 9/2014 |
| CN | 104065599 A | 9/2014 |
| CN | 104604161 A | 5/2015 |
| CN | 104756453 A | 7/2015 |
| CN | 104871465 A | 8/2015 |

OTHER PUBLICATIONS

Tarik S. Shehata et al. Joint Iterative Detection and Phase Noise Estimation Algorithms Using Kalman Filtering, 2009 IEEE. pp. 165-168. XP31471488.

Extended European Search Report issued in European Application No. 15909463.0 dated Oct. 22, 2018, 9 pages.

Seb J. Savory, Digital Coherent Optical Receivers: Algorithms and Subsystems. IEEE Journal of Selected Topics in Quantum Electronics, vol. 16, No. 5, Sep./Oct. 2010, 16 pages.

John B. Anderson et al, Turbo Equalization and an M-BCJR Algorithm for Strongly Narrowband Intersymbol Interference. ISITA2010, Taichung, Taiwan, Oct. 17-20, 2010, 6 pages.

International Search Report issued in International Application No. PCT/CN2015/095988 dated Jul. 26, 2018, 16 pages.

Office Action issued in Chinese Application No. 201580084610.7 dated Sep. 29, 2019, 8 pages.

\* cited by examiner

SIGNAL PROCESSING SYSTEM AND METHOD, AND APPARATUS

CROSS-REFERENCE TO RELATED APPLICATIONS

This application is a continuation of International Application No. PCT/CN2015/095988, filed on Nov. 30, 2015, the disclosure of which is hereby incorporated by reference in its entirety.

TECHNICAL FIELD

The present invention relates to the communications field, and in particular, to a signal processing system and method, and an apparatus.

BACKGROUND

Spectrum effectiveness is a net bit rate, or a ratio of a maximum throughput to a bandwidth of a communication channel or a data link, and is a key indicator of communications system design. Higher spectrum effectiveness leads to a higher communication rate and a higher user capacity, and the like, thereby improving performance of an entire communications system.

Specifically, spectrum effectiveness may be usually improved by compressing a spectral width at present. However, in this manner, intersymbol interference (ISI) is caused, degrading system performance. In view of this problem, a digital signal processing technology may currently be used on a transmitter side, and a finite impulse response filter is used to compress a signal bandwidth through pre-shaping. Different from a structure used by a conventional communications system: an equalizer+a phase recovery module+a forward error correction (FEC) module, for this ultra-narrowband signal, after the phase recovery module and before the FEC, a post filter and a sequence detector are usually added to resist the ISI and improve the system performance, specifically, as shown in FIG. 1.

Specifically, the sequence detector may perform sequence detection on a signal output by the post filter, so as to resist the intersymbol interference caused when the post filter performs noise filtering on the signal, so that sequence symbols in the signal are correctly recovered. The sequence detector outputs corresponding sequence detection soft value information to the FEC, and the FEC performs error detection on the sequence detection soft value information to recover an original signal. Further, soft value information may be exchanged in a turbo iteration manner between the sequence detector and the FEC, so as to improve the system performance. For example, the FEC may feed back corresponding error detection soft value information to the sequence detector, so that the sequence detector may further perform, based on the error detection soft value information fed back by the FEC, sequence detection on the signal output by the post filter and output new sequence detection soft value information to the FEC, and the FEC performs error detection on the new sequence detection soft value information based on the previous error detection soft value information, so as to more accurately recover the original signal. The soft value information may be information about a probability that the sequence symbols in the signal are a specified symbol (such as 0 or 1), and/or information about a ratio of probabilities that the sequence symbols are different specified symbols (for example, a ratio of a probability for 0 to a probability for 1), and so on.

However, for a bandwidth-limited system (such as a system in which the ISI exists), a received signal generally may be greatly degraded. This may be specifically reflected as a decrease in output signal quality of the equalizer. When phase recovery is performed on such a signal by using the phase recovery module, cycle skipping is frequently caused, and an incorrect signal generated is transmitted to the post filter. Consequently, input signal quality of the post filter is degraded. In addition, it may be learned from FIG. 1 that input of turbo iteration is from output of the post filter. If the input signal quality of the post filter is degraded, iteration between the sequence detection and the FEC cannot improve or cannot greatly improve the input signal quality of the post filter, resulting in a limitation on a compensation capability of the turbo iteration. Therefore, performance improvement of the entire system is limited.

In other words, when the existing turbo iteration manner is used to improve the system performance, there exists a problem that performance improvement of the entire system is limited because the input signal quality of the post filter cannot be improved or cannot be greatly improved. As a result, a system performance improvement effect is not good.

SUMMARY

Embodiments of the present invention provide a signal processing system and method, and an apparatus, so as to resolve a problem that performance improvement of an entire communications system is limited because an existing turbo iteration manner is used to improve performance of the communications system but cannot improve or cannot greatly improve input signal quality of a post filter.

According to a first aspect, a signal processing system is provided, including:

a phase recovery apparatus, configured to: receive a signal output by an equalizer and a feedback signal fed back by an information iteration apparatus, perform, based on the feedback signal, phase recovery on the signal output by the equalizer, and output a phase-recovered signal to a post filtering apparatus;

the post filtering apparatus, configured to: perform noise filtering on the phase-recovered signal output by the phase recovery apparatus, and output a noise-filtered signal to the information iteration apparatus; and the information iteration apparatus, configured to: perform, in a soft value information iteration manner, sequence detection and error detection on the noise-filtered signal output by the post filtering apparatus, so as to recover an original signal, use, as the feedback signal, sequence detection information obtained when the sequence detection is performed and/or error detection information obtained when the error detection is performed, and feed back the feedback signal to the phase recovery apparatus.

With reference to the first aspect, in a first possible implementation of the first aspect, the phase recovery apparatus is specifically configured to: extract, based on the received feedback signal, a phase offset of the signal output by the equalizer, calculate an average value of the phase offset to obtain phase offset data, and perform, based on the phase offset data, the phase recovery on the signal output by the equalizer.

With reference to the first aspect or the first possible implementation of the first aspect, in a second possible implementation of the first aspect, the sequence detection information is sequence detection soft value information and/or sequence detection hard decision information, and the error detection information is error detection soft value information and/or error detection hard decision information. Soft value information is information used to reflect a probability that sequence symbols in the signal are a specified symbol, and/or information used to reflect a ratio of probabilities that the sequence symbols in the signal are different specified symbols, and hard decision information is information used to reflect specific values of the sequence symbols in the signal.

With reference to the second possible implementation of the first aspect, in a third possible implementation of the first aspect, the information iteration apparatus includes a sequence detection device and an FEC device.

The sequence detection device is configured to: receive the error detection soft value information fed back by the FEC device, perform, based on the error detection soft value information, the sequence detection on the noise-filtered signal output by the post filtering apparatus, output the sequence detection soft value information to the FEC device, use, as the feedback signal, the sequence detection soft value information and/or the sequence detection hard decision information that is obtained when the sequence detection is performed on the noise-filtered signal output by the post filtering apparatus, and feed back the feedback signal to the phase recovery apparatus.

The FEC device is configured to: perform error detection on the sequence detection soft value information output by the sequence detection device, so as to recover the original signal, and feed back the error detection soft value information to the sequence detection device.

With reference to the second possible implementation of the first aspect, in a fourth possible implementation of the first aspect, the information iteration apparatus includes a sequence detection device and an FEC device.

The sequence detection device is configured to: receive the error detection soft value information fed back by the FEC device, perform, based on the error detection soft value information, the sequence detection on the noise-filtered signal output by the post filtering apparatus, and output the sequence detection soft value information to the FEC device.

The FEC device is configured to: perform error detection on the sequence detection soft value information output by the sequence detection device, so as to recover the original signal, feed back the error detection soft value information to the sequence detection device, use, as the feedback signal, the error detection soft value information and/or the error detection hard decision information that is obtained when the error detection is performed on the sequence detection soft value information output by the sequence detection device, and feed back the feedback signal to the phase recovery apparatus.

With reference to the second possible implementation of the first aspect, in a fifth possible implementation of the first aspect, the information iteration apparatus includes a sequence detection device and an FEC device.

The sequence detection device is configured to: receive the error detection soft value information fed back by the FEC device, perform, based on the error detection soft value information, the sequence detection on the noise-filtered signal output by the post filtering apparatus, output the sequence detection soft value information to the FEC device, use, as the feedback signal, the sequence detection soft value information and/or the sequence detection hard decision information that is obtained when the sequence detection is performed on the noise-filtered signal output by the post filtering apparatus, and feed back the feedback signal to the phase recovery apparatus.

The FEC device is configured to: perform error detection on the sequence detection soft value information output by the sequence detection device, so as to recover the original signal, feed back the error detection soft value information to the sequence detection device, use, as the feedback signal, the error detection soft value information and/or the error detection hard decision information that is obtained when the error detection is performed on the sequence detection soft value information output by the sequence detection device, and feed back the feedback signal to the phase recovery apparatus.

With reference to the first aspect or the first possible implementation of the first aspect, in a sixth possible implementation of the first aspect, a quantity of times the information iteration apparatus feeds back the feedback signal to the phase recovery apparatus is not greater than a quantity of times of soft value information iteration performed by the information iteration apparatus.

According to a second aspect, a signal processing method is provided, including:

receiving, by a phase recovery apparatus, a signal output by an equalizer and a feedback signal fed back by an information iteration apparatus; and performing, based on the feedback signal, phase recovery on the signal output by the equalizer, and outputting a phase-recovered signal to a post filtering apparatus, so that the post filtering apparatus performs noise filtering on the phase-recovered signal, and outputs a noise-filtered signal to the information iteration apparatus, where the feedback signal is sequence detection information and/or error detection information that are/is obtained when the information iteration apparatus performs, in a soft value information iteration manner, sequence detection and error detection on the noise-filtered signal output by the post filtering apparatus.

With reference to the second aspect, in a first possible implementation of the second aspect, the performing, based on the feedback signal, phase recovery on the signal output by the equalizer includes:

extracting, based on the received feedback signal, a phase offset of the signal output by the equalizer, calculating an average value of the phase offset to obtain phase offset data, and performing, based on the phase offset data, the phase recovery on the signal output by the equalizer.

With reference to the second aspect or the first possible implementation of the second aspect, in a second possible implementation of the second aspect, the sequence detection information is sequence detection soft value information and/or sequence detection hard decision information, and the error detection information is error detection soft value information and/or error detection hard decision information. Soft value information is information used to reflect a probability that sequence symbols in the signal are a specified symbol, and/or information used to reflect a ratio of probabilities that the sequence symbols in the signal are different specified symbols, and hard decision information is information used to reflect specific values of the sequence symbols in the signal.

With reference to the second aspect or the first possible implementation of the second aspect, in a third possible implementation of the second aspect, a quantity of times the information iteration apparatus feeds back the feedback signal to the phase recovery apparatus is not greater than a quantity of times of soft value information iteration performed by the information iteration apparatus.

According to a third aspect, a phase recovery apparatus is provided, where the apparatus includes:

a receiving module, configured to receive a signal output by an equalizer and a feedback signal fed back by an information iteration apparatus;

a phase recovery module, configured to perform, based on the feedback signal, phase recovery on the signal output by the equalizer; and an output module, configured to output a phase-recovered signal to a post filtering apparatus, so that the post filtering apparatus performs noise filtering on the phase-recovered signal, and outputs a noise-filtered signal to the information iteration apparatus, where the feedback signal is sequence detection information and/or error detection information that are/is obtained when the information iteration apparatus performs, in a soft value information iteration manner, sequence detection and error detection on the noise-filtered signal output by the post filtering apparatus.

With reference to the third aspect, in a first possible implementation of the third aspect, the phase recovery module is specifically configured to: extract, based on the received feedback signal, a phase offset of the signal output by the equalizer, calculate an average value of the phase offset to obtain phase offset data, and perform, based on the phase offset data, the phase recovery on the signal output by the equalizer.

With reference to the third aspect or the first possible implementation of the third aspect, in a second possible implementation of the third aspect, the sequence detection information is sequence detection soft value information and/or sequence detection hard decision information, and the error detection information is error detection soft value information and/or error detection hard decision information. Soft value information is information used to reflect a probability that sequence symbols in the signal are a specified symbol, and/or information used to reflect a ratio of probabilities that the sequence symbols in the signal are different specified symbols, and hard decision information is information used to reflect specific values of the sequence symbols in the signal.

With reference to the third aspect or the first possible implementation of the third aspect, in a third possible implementation of the third aspect, a quantity of times the information iteration apparatus feeds back the feedback signal to the phase recovery apparatus is not greater than a quantity of times of soft value information iteration performed by the information iteration apparatus.

According to a fourth aspect, a phase recovery apparatus is provided, where the apparatus includes:

a receiver, configured to receive a signal output by an equalizer and a feedback signal fed back by an information iteration apparatus;

a processor, configured to perform, based on the feedback signal received by the receiver, phase recovery on the signal output by the equalizer; and a transmitter, configured to output a phase-recovered signal to a post filtering apparatus, so that the post filtering apparatus performs noise filtering on the phase-recovered signal, and outputs a noise-filtered signal to the information iteration apparatus, where the feedback signal is sequence detection information and/or error detection information that are/is obtained when the information iteration apparatus performs, in a soft value information iteration manner, sequence detection and error detection on the noise-filtered signal output by the post filtering apparatus.

With reference to the fourth aspect, in a first possible implementation of the fourth aspect, the processor is specifically configured to: extract, based on the received feedback signal, a phase offset of the signal output by the equalizer, calculate an average value of the phase offset to obtain phase offset data, and perform, based on the phase offset data, the phase recovery on the signal output by the equalizer.

With reference to the fourth aspect or the first possible implementation of the fourth aspect, in a second possible implementation of the fourth aspect, the sequence detection information is sequence detection soft value information and/or sequence detection hard decision information, and the error detection information is error detection soft value information and/or error detection hard decision information. Soft value information is information used to reflect a probability that sequence symbols in the signal are a specified symbol, and/or information used to reflect a ratio of probabilities that the sequence symbols in the signal are different specified symbols, and hard decision information is information used to reflect specific values of the sequence symbols in the signal.

With reference to the fourth aspect or the first possible implementation of the fourth aspect, in a third possible implementation of the fourth aspect, a quantity of times the information iteration apparatus feeds back the feedback signal to the phase recovery apparatus is not greater than a quantity of times of soft value information iteration performed by the information iteration apparatus.

According to the system, the method, and the apparatus provided in the first to the fourth aspects, the phase recovery apparatus may perform, based on the feedback signal fed back by the information iteration apparatus, the phase recovery on the signal output by the equalizer, and output the phase-recovered signal to the post filtering apparatus, so that the post filtering apparatus performs the noise filtering on the phase-recovered signal, and outputs the noise-filtered signal to the information iteration apparatus. The feedback signal is the sequence detection information and/or the error detection information that are/is obtained when the information iteration apparatus performs, in the soft value information iteration manner, the sequence detection and the error detection on the noise-filtered signal output by the post filtering apparatus. In other words, when the soft value information is exchanged in the information iteration apparatus in the turbo iteration manner to improve the system performance, the soft value information and/or the hard decision information may be iterated between the phase recovery apparatus and the information iteration apparatus, so that the phase recovery is performed on the signal output by the equalizer. Output of the information iteration apparatus is more accurate in determining the signal. Therefore, precision of the phase recovery can be greatly improved, and cycle skipping is reduced, further, the input signal quality of the post filtering apparatus can be improved, the problem that performance improvement of the entire system is limited because the existing turbo iteration manner is used to improve the system performance but cannot improve or cannot greatly improve the input signal quality of the post filter is resolved, and the system performance is improved.

BRIEF DESCRIPTION OF DRAWINGS

To describe the technical solutions in the embodiments of the present invention more clearly, the following briefly describes the accompanying drawings required for describing the embodiments. Apparently, the accompanying drawings in the following description show merely some embodiments of the present invention, and persons of ordinary skill in the art may still derive other drawings from these accompanying drawings without creative efforts.

DESCRIPTION OF EMBODIMENTS

To make the objectives, technical solutions, and advantages of the present invention clearer, the following further describes the present invention in detail with reference to the accompanying drawings. Apparently, the described embodiments are merely some rather than all of the embodiments of the present invention. All other embodiments obtained by persons of ordinary skill in the art based on the embodiments of the present invention without creative efforts shall fall within the protection scope of the present invention.

Embodiment 1

Figure 1:
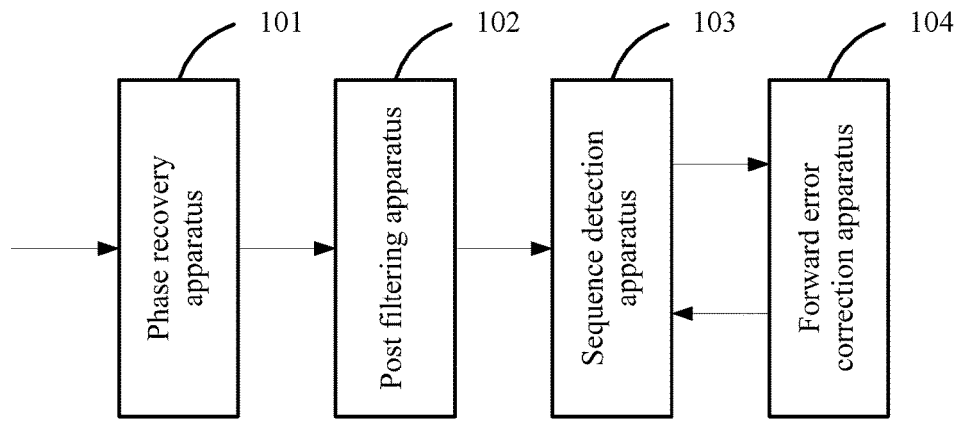
FIG. 1 is a schematic structural diagram of an existing signal processing system for ISI.
Figure 2:
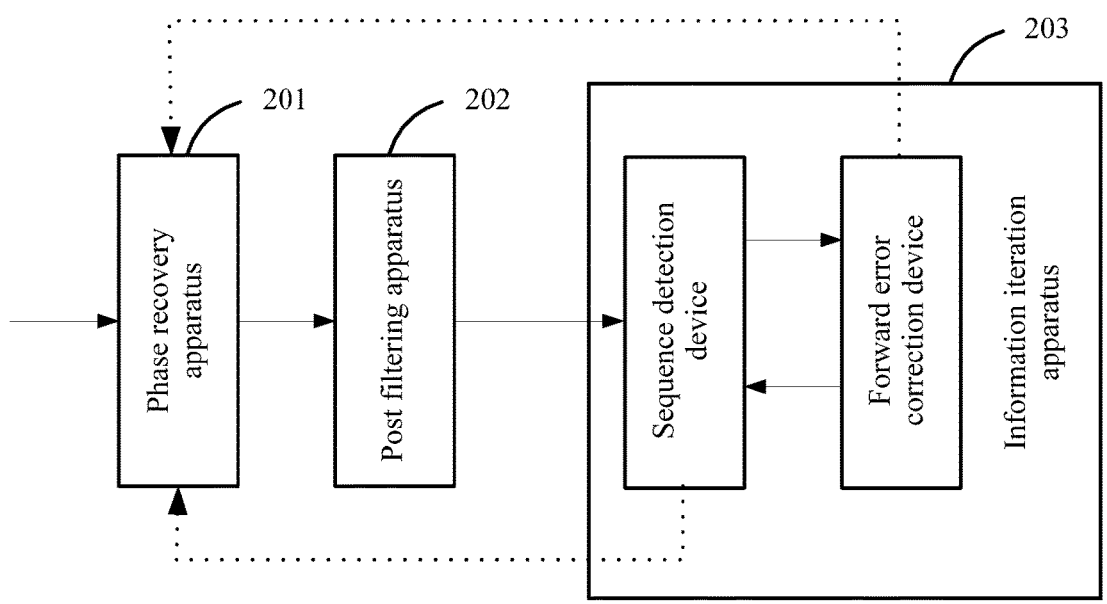
FIG. 2 is a schematic structural diagram of a signal processing system according to Embodiment 1 of the present invention.

Embodiment 1 of the present invention provides a signal processing system. The signal processing system may be applied to any communications system receiver that uses a turbo iteration manner to process ISI, and this is not limited in this embodiment of the present invention. Specifically, as shown in FIG. 2, FIG. 2 is a schematic structural diagram of the signal processing system according to Embodiment 1 of the present invention. The system includes a phase recovery apparatus 201, a post filtering apparatus 202, and an information iteration apparatus 203.

The phase recovery apparatus 201 is configured to: receive a signal output by an equalizer and a feedback signal fed back by the information iteration apparatus 203, perform, based on the feedback signal, phase recovery on the signal output by the equalizer, and output a phase-recovered signal to the post filtering apparatus 202.

The post filtering apparatus 202 is configured to: perform noise filtering on the phase-recovered signal output by the phase recovery apparatus 201, and output a noise-filtered signal to the information iteration apparatus 203.

The information iteration apparatus 203 is configured to: perform, in a soft value information iteration manner, sequence detection and error detection on the noise-filtered signal output by the post filtering apparatus 202, so as to recover an original signal, use, as the feedback signal, sequence detection information obtained when the sequence detection is performed and/or error detection information obtained when the error detection is performed, and feed back the feedback signal to the phase recovery apparatus 201.

To be specific, in the signal processing system provided in this embodiment, the phase recovery apparatus 201 may perform, based on the feedback signal fed back by the information iteration apparatus 203, the phase recovery on the signal output by the equalizer, and output the phase-recovered signal to the post filtering apparatus 202, so that the post filtering apparatus 202 performs the noise filtering on the phase-recovered signal, and outputs the noise-filtered signal to the information iteration apparatus 203. The feedback signal is the sequence detection information and/or the error detection information that are/is obtained when the information iteration apparatus 203 performs, in the soft value information iteration manner, the sequence detection and the error detection on the noise-filtered signal output by the post filtering apparatus 202.

In other words, when soft value information is exchanged in the information iteration apparatus 203 in a turbo iteration manner to improve system performance, the soft value information and/or hard decision information may be iterated between the phase recovery apparatus 201 and the information iteration apparatus 203, so that the phase recovery is performed on the signal output by the equalizer. Output of the information iteration apparatus 203 is more accurate in determining the signal. Therefore, precision of the phase recovery can be greatly improved, and cycle skipping is reduced, further, input signal quality of the post filtering apparatus 202 can be improved, a problem that performance improvement of an entire system is limited because an existing turbo iteration manner is used to improve the system performance but cannot improve or cannot greatly improve input signal quality of a post filter is resolved, and the system performance is improved.

Optionally, the phase recovery apparatus 201 is specifically configured to: extract, based on the received feedback signal, a phase offset of the signal output by the equalizer, calculate an average value of the phase offset to obtain phase offset data, and perform, based on the phase offset data, the phase recovery on the signal output by the equalizer.

Further, it should be noted that, because at an initial stage, the phase recovery apparatus 201 usually can receive only the signal output by the equalizer, and cannot receive the feedback signal fed back by the information iteration apparatus 203. Therefore, at the initial phase recovery stage, the phase recovery apparatus 201 may be specifically configured to: perform predetermine processing on the signal output by the equalizer, to obtain predetermine data of the signal, calculate the phase offset based on the predetermine data, perform averaging processing on the phase offset to obtain the phase offset data, and perform, based on the phase offset data, the phase recovery on the signal output by the equalizer, to output the phase-recovered signal to the post filtering apparatus 202. Then, the post filtering apparatus 202 performs the noise filtering on the phase-recovered signal output by the phase recovery apparatus 201, and outputs the noise-filtered signal to the information iteration apparatus 203.

Then (to be specific, at a subsequent phase recovery stage), if receiving the feedback signal fed back by the information iteration apparatus 203, the phase recovery apparatus 201 may perform, based on the feedback signal, the phase recovery on the signal output by the equalizer, so as to implement signal iteration processing based on the phase recovery apparatus 201 and the information iteration apparatus 203.

Certainly, it should be noted that, at the subsequent phase recovery stage, in addition to performing, based on the feedback signal, the phase recovery on the signal output by the equalizer, the phase recovery apparatus 201 may reuse phase-recovered data in a previous cycle (in other words, there is no need to perform the phase recovery again for every iteration), and this is not limited in this embodiment.

Optionally, similar to the prior art, the phase recovery apparatus 201 may specifically include a predetermine circuit and a Maximum Likelihood (ML) estimation circuit (also referred to as a sliding window average estimation circuit).

The predetermine circuit may be configured to: receive the signal output by the equalizer, perform the predetermine processing on the signal output by the equalizer, to obtain the predetermine data, and output the predetermine data to the ML estimation circuit.

The ML estimation circuit may be configured to: at the initial phase recovery stage, calculate, based on the predetermine data, the phase offset, perform the averaging processing, to obtain first phase offset data, perform, based on the first phase offset data, initial phase recovery on the signal output by the equalizer, and output an initial phase-recovered signal to the post filtering apparatus 202. Then, after performing the noise filtering on the initial phase-recovered signal, the post filtering apparatus 202 outputs the noise-filtered signal to the information iteration apparatus 203.

At the subsequent phase recovery stage, the ML estimation circuit receives the feedback signal fed back by the information iteration apparatus 203, calculates the phase offset of the signal based on the received feedback signal, calculates the average value of the phase offset, to obtain second phase offset data, performs, based on the second phase offset data, the phase recovery on the signal output by the equalizer, and outputs the phase-recovered signal to the post filtering apparatus 202.

In other words, when performing, for the first time, the phase recovery on the signal output by the equalizer, the phase recovery apparatus 201 may perform the predetermine processing on the signal based on the predetermine circuit, to obtain the predetermine data, then extract the phase offset based on the ML estimation circuit, and perform the averaging processing on the extracted phase offset, so as to reduce impact of misjudgment in the predetermine processing and improve accuracy of the phase recovery. In addition, when subsequently performing the phase recovery on the signal output by the equalizer, the phase recovery apparatus 201 may perform, based on the ML estimation circuit and the received feedback signal, the phase recovery on the signal output by the equalizer. The feedback signal is more accurate judgment data. Therefore, the feedback signal is used to replace severely misjudged predetermine data, so that precision of the phase recovery can be greatly improved, the cycle skipping is reduced, further, the input signal quality of the post filtering apparatus 202 is improved, and the system performance is improved.

It should be noted that, because predetermine accuracy of the predetermine circuit can determine basic performance of the phase recovery, an appropriate predetermine algorithm may be selected based on a type of a to-be-processed signal, so as to improve predetermine accuracy and ensure the basic performance of the phase recovery. For example, for a Quadrature Phase Shift Keying (QPSK) signal, a quartic predetermine algorithm may be used. For a Quadrature Amplitude Modulation (16QAM) signal, a more complex algorithm may be used, for example, a Blind Phase Search (BPS) algorithm, and details are not described herein in this embodiment.

Further, it should be noted that the sequence detection information is sequence detection soft value information and/or sequence detection hard decision information, and the error detection information is error detection soft value information and/or error detection hard decision information. The soft value information is information used to reflect a probability that sequence symbols in the signal are a specified symbol, and/or information used to reflect a ratio of probabilities that the sequence symbols in the signal are different specified symbols. The hard decision information is information used to reflect specific values of the sequence symbols in the signal.

For example, in a 2-level modulation system, sequence symbols in a signal are generally either 0 or 1. Therefore, in this case, soft value information may be generally information used to reflect a probability that the sequence symbols in the signal are 0 or 1, and/or may be further information used to reflect a ratio of a probability of 0 for the sequence symbols in the signal to a probability of 1 for the sequence symbols in the signal (that is, a fuzzy determining result). Similarly, hard decision information may be generally information used to reflect that the sequence symbols in the signal are specifically 0 or 1 (that is, a definite determining result), and details are not described herein.

In addition, it should be noted that the system provided in this embodiment is not only applicable to the 2-level modulation system, but also applicable to a higher order modulation system. Therefore, the specified symbol may be another value in addition to "0" and "1", and this is not limited in this embodiment.

Optionally, the information iteration apparatus 203 includes a sequence detection device and an FEC device.

The sequence detection device may be configured to: receive the error detection soft value information fed back by the FEC device, perform, based on the error detection soft value information, the sequence detection on the noise-filtered signal output by the post filtering apparatus 202, output the sequence detection soft value information to the FEC device, use, as the feedback signal, the sequence detection soft value information and/or the sequence detection hard decision information that is obtained when the sequence detection is performed on the noise-filtered signal output by the post filtering apparatus 202, and feed back the feedback signal to the phase recovery apparatus 201.

The FEC device may be configured to: perform error detection on the sequence detection soft value information output by the sequence detection device, so as to recover the original signal, and feed back the error detection soft value information to the sequence detection device.

In other words, the feedback signal received by the phase recovery apparatus 201 may be only the sequence detection information obtained when the information iteration apparatus 203 performs the sequence detection.

Certainly, the feedback signal received by the phase recovery apparatus 201 may also be only the error detection information obtained when the information iteration apparatus 203 performs the error detection. In this case, the sequence detection device and the FEC device that are included in the information iteration apparatus 203 may be respectively configured to implement the following functions.

The sequence detection device may be configured to: receive the error detection soft value information fed back by the FEC device, perform, based on the error detection soft value information, the sequence detection on the noise-filtered signal output by the post filtering apparatus 202, and output the sequence detection soft value information to the FEC device.

The FEC device may be configured to: perform error detection on the sequence detection soft value information output by the sequence detection device, so as to recover the original signal, feed back the error detection soft value information to the sequence detection device, use, as the feedback signal, the error detection soft value information and/or the error detection hard decision information that is obtained when the error detection is performed on the sequence detection soft value information output by the sequence detection device, and feed back the feedback signal to the phase recovery apparatus 201.

Further, the feedback signal received by the phase recovery apparatus 201 may further be the sequence detection information obtained when the information iteration apparatus 203 performs the sequence detection and the error detection information obtained when the information iteration apparatus 203 performs the error detection. In this case, the sequence detection device and the FEC device that are included in the information iteration apparatus 203 may be respectively configured to implement the following functions.

The sequence detection device may be configured to: receive the error detection soft value information fed back by the FEC device, perform, based on the error detection soft value information, the sequence detection on the noise-filtered signal output by the post filtering apparatus 202, output the sequence detection soft value information to the FEC device, use, as the feedback signal, the sequence detection soft value information and/or the sequence detection hard decision information that is obtained when the sequence detection is performed on the noise-filtered signal output by the post filtering apparatus 202, and feed back the feedback signal to the phase recovery apparatus 201.

The FEC device may be configured to: perform error detection on the sequence detection soft value information output by the sequence detection device, so as to recover the original signal, feed back the error detection soft value information to the sequence detection device, use, as the feedback signal, the error detection soft value information and/or the error detection hard decision information that is obtained when the error detection is performed on the sequence detection soft value information output by the sequence detection device, and feed back the feedback signal to the phase recovery apparatus 201.

It should be noted that the phase recovery is performed, based on the sequence detection soft value information and/or the sequence detection hard decision information that are/is fed back by the sequence detection device, on the signal output by the equalizer. This provides an advantage of a relatively short iteration delay, but a disadvantage of relatively low accuracy. The phase recovery is performed, based on the error detection soft value information and/or the error detection hard decision information that are/is fed back by the FEC device, on the signal output by the equalizer. This provides an advantage of relatively high accuracy, but a disadvantage of a relatively long iteration delay. Therefore, an appropriate feedback signal may be selected based on an actual situation, and details are not described herein in this embodiment.

Further, it should be noted that a quantity of times the information iteration apparatus 203 feeds back the feedback signal to the phase recovery apparatus 201 is not greater than a quantity of times of soft value information iteration performed by the information iteration apparatus 203.

To be specific, a quantity of times the sequence detection device feeds back the sequence detection soft value information and/or the sequence detection hard decision information to the phase recovery apparatus 201, and a quantity of times the FEC device feeds back the error detection soft value information and/or the error detection hard decision information to the phase recovery apparatus 201 may be separately designed based on the system performance, but are less than or equal to a quantity of times the FEC device feeds back the error detection soft value information to the sequence detection device. In other words, after the turbo iteration between the sequence detection device and the FEC device stops, the sequence detection device and/or the FEC device do/does not feed back a corresponding feedback signal to the phase recovery apparatus 201. However, when iteration between the sequence detection device and/or the FEC device and the phase recovery apparatus 201 stops or does not start, the corresponding turbo iteration may still be performed between the sequence detection device and the FEC device, and details are not described herein again in this embodiment.

The following describes a specific working procedure of the signal processing system according to this embodiment of the present invention by using two specific examples.

Example 1

It is assumed that the phase recovery apparatus includes the predetermine circuit and the ML estimation circuit, and feedback data received by the phase recovery apparatus (which is specifically the ML estimation circuit of the phase recovery apparatus) is from the sequence detection device. In this case, a structure of the signal processing system may be specifically shown in FIG. 3. It may be learned from FIG. 3 that in this case, a working procedure of the signal processing system may be specifically as follows:

The predetermine circuit receives the signal output by the equalizer, performs the predetermine processing on the signal output by the equalizer, to obtain the predetermine data, and outputs the predetermine data to the ML estimation circuit.

The ML estimation circuit calculates the phase offset based on the predetermine data, performs the averaging processing, to obtain the first phase offset data, performs, based on the first phase offset data, the initial phase recovery on the signal output by the equalizer, and outputs the initial phase-recovered signal to the post filtering apparatus.

The post filtering apparatus performs the noise filtering on the initial phase-recovered signal, and outputs the noise-filtered signal to the sequence detection device.

The sequence detection device performs the sequence detection on the noise-filtered signal based on the error detection soft value information fed back by the FEC device, outputs the sequence detection soft value information to the FEC device, uses, as the feedback signal, the sequence detection soft value information and/or the sequence detection hard decision information that is obtained when the sequence detection is performed on the noise-filtered signal output by the post filtering apparatus, and feeds back the feedback signal to the ML estimation circuit of the phase recovery apparatus. In this way, after receiving the feedback signal fed back by the sequence detection device, the ML estimation circuit may perform, based on the feedback signal, the phase recovery again on the signal output by the equalizer, and output a new phase-recovered signal to the post filtering apparatus, so as to implement information iteration between the phase recovery apparatus and the sequence detection device.

Correspondingly, after receiving the sequence detection soft value information output by the sequence detection device, the FEC device may perform the error detection on the sequence detection soft value information output by the sequence detection device, so as to recover the original signal, and feed back the error detection soft value information to the sequence detection device. In this way, the sequence detection device may perform, based on the error detection soft value information fed back by the FEC device, the sequence detection again on the noise-filtered signal output by the post filtering apparatus, output new sequence detection soft value information to the FEC device, and use the new sequence detection soft value information and/or the sequence detection hard decision information as a new feedback signal, and send the new feedback signal to the phase recovery apparatus, so that the FEC device may perform error detection on the new sequence detection soft value information, so as to more accurately recover the original signal.

The quantity of times the FEC device feeds back the error detection soft value information to the sequence detection device may be the same as the quantity of times the sequence detection device feeds back the feedback signal to the phase recovery apparatus, or may be greater than the quantity of times the sequence detection device feeds back the feedback signal to the phase recovery apparatus. Specifically, in FIG. 3, a schematic description is provided for an example in which the quantity of times the FEC device feeds back the error detection soft value information to the sequence detection device is the same as the quantity of times the sequence detection device feeds back the feedback signal to the phase recovery apparatus.

Figure 3:
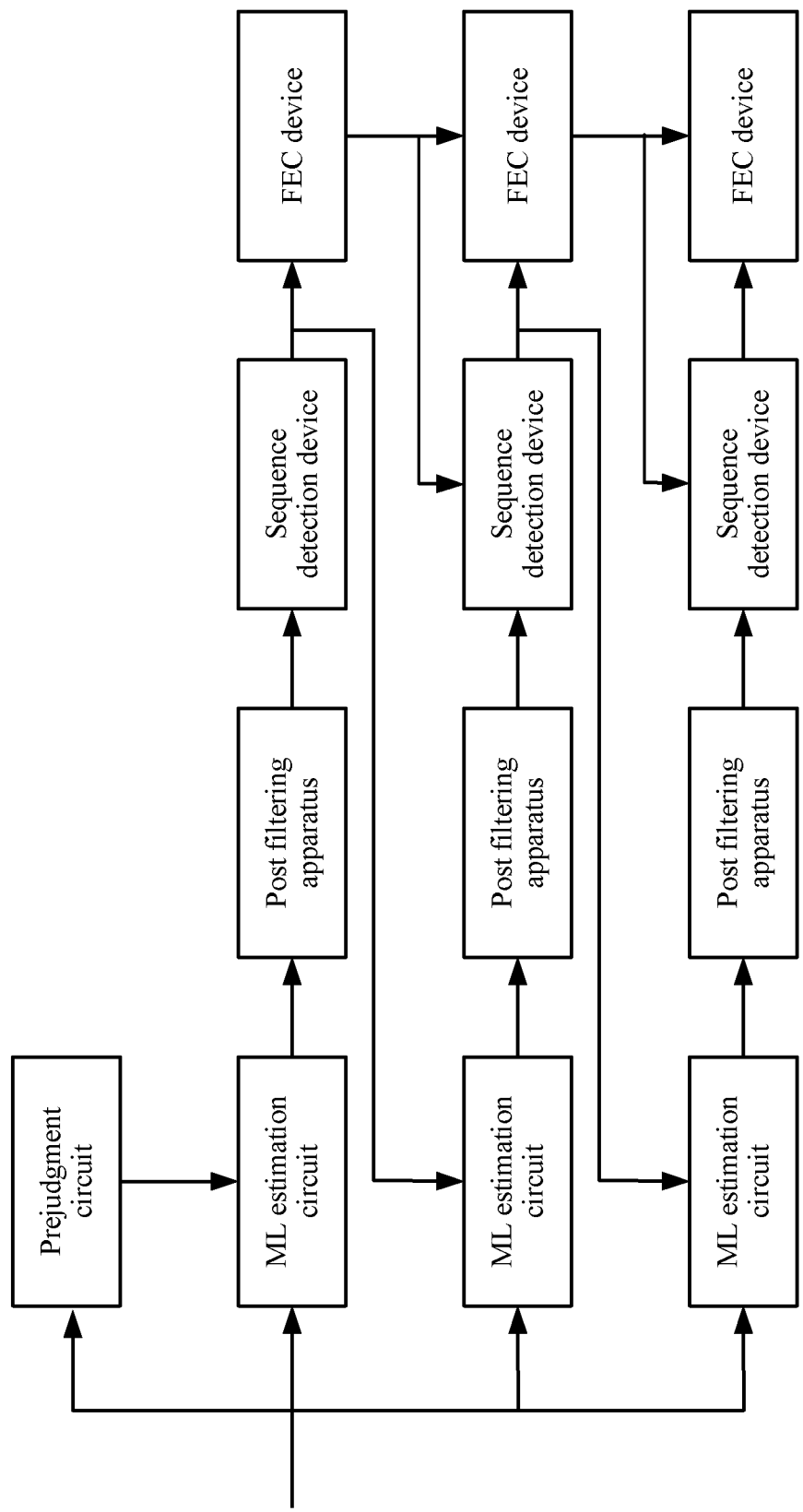
FIG. 3 is a specific schematic structural diagram of the signal processing system according to Embodiment 1 of the present invention.

In addition, it should be noted that in an actual signal processing system, there may be only one ML estimation circuit, post filtering apparatus, FEC device, and the like respectively, and corresponding functions may be implemented through cyclic processing and iteration. As shown in FIG. 3, there may also be a plurality of ML estimation circuits, post filtering apparatuses, FEC devices, and the like respectively, for example, there are three ML estimation circuits and three post filtering apparatuses (that is, a quantity of times of information iteration between the phase recovery apparatus and the sequence detection device is two). There are also three sequence detection devices and three FEC devices (that is, a quantity of times of the turbo iteration is also two). Details are not described herein again in this embodiment.

Example 2

It is assumed that the phase recovery apparatus includes the predetermine circuit and the ML estimation circuit, and feedback data received by the phase recovery apparatus (which is specifically the ML estimation circuit of the phase recovery apparatus) is from the FEC device. In this case, a structure of the signal processing system may be specifically shown in FIG. 4. It may be learned from FIG. 4 that in this case, a working procedure of the signal processing system may be specifically as follows:

The predetermine circuit receives the signal output by the equalizer, performs the predetermine processing on the signal output by the equalizer, to obtain the predetermine data, and outputs the predetermine data to the ML estimation circuit.

The ML estimation circuit calculates the phase offset based on the predetermine data, performs the averaging processing, to obtain the first phase offset data, performs, based on the first phase offset data, the initial phase recovery on the signal output by the equalizer, and outputs the initial phase-recovered signal to the post filtering apparatus.

The post filtering apparatus performs the noise filtering on the initial phase-recovered signal, and outputs the noise-filtered signal to the sequence detection device.

The sequence detection device performs the sequence detection on the noise-filtered signal based on the error detection soft value information fed back by the FEC device, and outputs the sequence detection soft value information to the FEC device.

Correspondingly, after receiving the sequence detection soft value information output by the sequence detection device, the FEC device may perform the error detection on the sequence detection soft value information output by the sequence detection device, so as to recover the original signal, feed back the error detection soft value information to the sequence detection device, use the error detection soft value information and/or the error detection hard decision information as the feedback signal, and feed back the feedback signal to the ML estimation circuit of the phase recovery apparatus. In this way, after receiving the feedback signal fed back by the FEC device, the ML estimation circuit may perform, based on the feedback signal, the phase recovery again on the signal output by the equalizer, and output a new phase-recovered signal to the post filtering apparatus, so as to implement information iteration between the phase recovery apparatus and the FEC device.

In addition, the sequence detection device may perform, based on the error detection soft value information fed back by the FEC device, the sequence detection again on the noise-filtered signal output by the post filtering apparatus, and output new sequence detection soft value information to the FEC device, so that the FEC device may perform error detection on the new sequence detection soft value information, so as to more accurately recover the original signal.

The quantity of times the FEC device feeds back the error detection soft value information to the sequence detection device may be the same as the quantity of times the FEC device feeds back the feedback signal to the phase recovery apparatus, or may be greater than the quantity of times the FEC device feeds back the feedback signal to the phase recovery apparatus. Specifically, in FIG. 4, a schematic description is provided for an example in which the quantity of times the FEC device feeds back the error detection soft value information to the sequence detection device is greater than the quantity of times the FEC device feeds back the feedback signal to the phase recovery apparatus.

Figure 4:
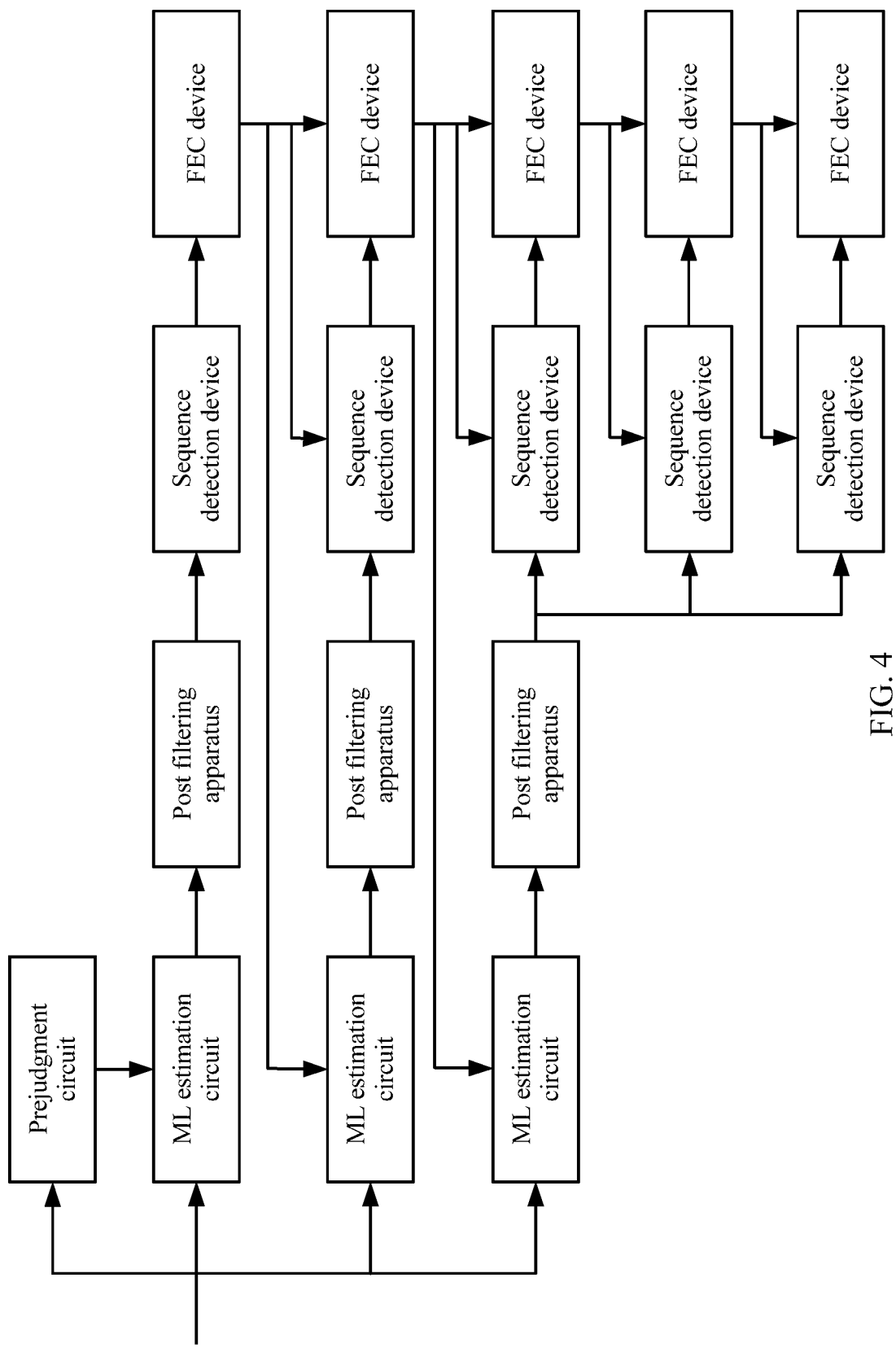
FIG. 4 is another specific schematic structural diagram of the signal processing system according to Embodiment 1 of the present invention.

In addition, it should be noted that in an actual signal processing system, there may be only one ML estimation circuit, post filtering apparatus, FEC device, and the like respectively, and corresponding functions may be implemented through cyclic processing and iteration. As shown in FIG. 4, there may also be a plurality of ML estimation circuits, post filtering apparatuses, FEC devices, and the like respectively, for example, there are three ML estimation circuits and three post filtering apparatuses (that is, a quantity of times of information iteration between the phase recovery apparatus and the FEC device is two). There are also five sequence detection devices and five FEC devices (that is, a quantity of times of the turbo iteration is four). Details are not described herein again in this embodiment.

It may be learned from the content in this embodiment of the present invention that, in the signal processing system provided in this embodiment, the phase recovery apparatus may perform, based on the feedback signal fed back by the information iteration apparatus, the phase recovery on the signal output by the equalizer, and output the phase-recovered signal to the post filtering apparatus, so that the post filtering apparatus performs the noise filtering on the phase-recovered signal, and outputs the noise-filtered signal to the information iteration apparatus. The feedback signal is the sequence detection information and/or the error detection information that are/is obtained when the information iteration apparatus performs, in the soft value information iteration manner, the sequence detection and the error detection on the noise-filtered signal output by the post filtering apparatus. In other words, when soft value information is exchanged in the information iteration apparatus in a turbo iteration manner to improve system performance, the soft value information and/or hard decision information may be iterated between the phase recovery apparatus and the information iteration apparatus, so that the phase recovery is performed on the signal output by the equalizer. Output of the information iteration apparatus is more accurate in determining the signal. Therefore, precision of the phase recovery can be greatly improved, and the cycle skipping is reduced, further, the input signal quality of the post filtering apparatus can be improved, a problem that performance improvement of the entire system is limited because the existing turbo iteration manner is used to improve the system performance but cannot improve or cannot greatly improve the input signal quality of the post filter is resolved, and the system performance is improved.

Embodiment 2

Figure 5:
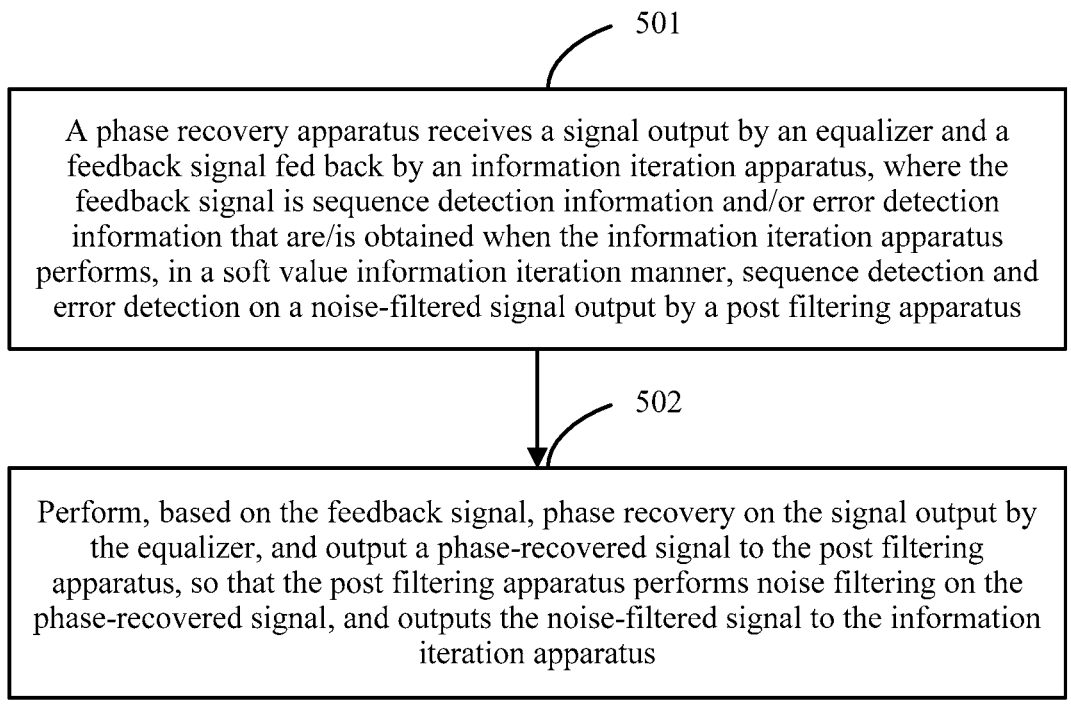
FIG. 5 is a step flowchart of the signal processing method according to Embodiment 2 of the present invention.

Based on a same inventive concept, Embodiment 2 of the present invention provides a signal processing method. Specifically, as shown in FIG. 5, FIG. 5 is a step flowchart of the signal processing method according to Embodiment 2 of the present invention, and the method includes the following steps.

Step 501: A phase recovery apparatus receives a signal output by an equalizer and a feedback signal fed back by an information iteration apparatus.

Step 502: Perform, based on the feedback signal, phase recovery on the signal output by the equalizer, and output a phase-recovered signal to a post filtering apparatus, so that the post filtering apparatus performs noise filtering on the phase-recovered signal, and outputs a noise-filtered signal to the information iteration apparatus.

The feedback signal is sequence detection information and/or error detection information that are/is obtained when the information iteration apparatus performs, in a soft value information iteration manner, sequence detection and error detection on the noise-filtered signal output by the post filtering apparatus.

To be specific, in the signal processing method provided in this embodiment, the phase recovery apparatus may perform, based on the feedback signal fed back by the information iteration apparatus, the phase recovery on the signal output by the equalizer, and output the phase-recovered signal to the post filtering apparatus, so that the post filtering apparatus performs the noise filtering on the phase-recovered signal, and outputs the noise-filtered signal to the information iteration apparatus. The feedback signal is the sequence detection information and/or the error detection information that are/is obtained when the information iteration apparatus performs, in the soft value information iteration manner, the sequence detection and the error detection on the noise-filtered signal output by the post filtering apparatus.

In other words, when soft value information is exchanged in the information iteration apparatus in a turbo iteration manner to improve system performance, the soft value information and/or hard decision information may be iterated between the phase recovery apparatus and the information iteration apparatus, so that the phase recovery is performed on the signal output by the equalizer. Output of the information iteration apparatus is more accurate in determining the signal. Therefore, precision of the phase recovery can be greatly improved, and cycle skipping is reduced, further, input signal quality of the post filtering apparatus can be improved, a problem that performance improvement of an entire system is limited because an existing turbo iteration manner is used to improve the system performance but cannot improve or cannot greatly improve the input signal quality of a post filter is resolved, and the system performance is improved.

Optionally, the performing, based on the feedback signal, phase recovery on the signal output by the equalizer includes:

extracting, based on the received feedback signal, a phase offset of the signal output by the equalizer, calculating an average value of the phase offset to obtain phase offset data, and performing, based on the phase offset data, the phase recovery on the signal output by the equalizer.

Further, it should be noted that, because at an initial stage, the phase recovery apparatus usually can receive only the signal output by the equalizer, and cannot receive the feedback signal fed back by the information iteration apparatus. Therefore, at the initial phase recovery stage, the phase recovery apparatus may specifically perform predetermine processing on the signal output by the equalizer, to obtain predetermine data of the signal, calculate the phase offset based on the predetermine data, perform averaging processing on the phase offset to obtain the phase offset data, and perform, based on the phase offset data, the phase recovery on the signal output by the equalizer, to output the phase-recovered signal to the post filtering apparatus. Then, the post filtering apparatus performs the noise filtering on the phase-recovered signal output by the phase recovery apparatus, and outputs the noise-filtered signal to the information iteration apparatus.

Then (to be specific, at a subsequent phase recovery stage), if receiving the feedback signal fed back by the information iteration apparatus, the phase recovery apparatus may perform, based on the feedback signal, the phase recovery on the signal output by the equalizer, so as to implement signal iteration processing based on the phase recovery apparatus and the information iteration apparatus.

Certainly, it should be noted that, at the subsequent phase recovery stage, in addition to performing, based on the feedback signal, the phase recovery on the signal output by the equalizer, the phase recovery apparatus may reuse phase-recovered data in a previous cycle (in other words, there is no need to perform the phase recovery again for every iteration), and this is not limited in this embodiment.

Further, it should be noted that the sequence detection information is sequence detection soft value information and/or sequence detection hard decision information, and the error detection information is error detection soft value information and/or error detection hard decision information. The soft value information is information used to reflect a probability that sequence symbols in the signal are a specified symbol, and/or information used to reflect a ratio of probabilities that the sequence symbols in the signal are different specified symbols. The hard decision information is information used to reflect specific values of the sequence symbols in the signal.

Further, it should be noted that a quantity of times the information iteration apparatus feeds back the feedback signal to the phase recovery apparatus is not greater than a quantity of times of soft value information iteration performed by the information iteration apparatus.

To be specific, a quantity of times the information iteration apparatus feeds back the sequence detection information and/or the error detection information to the phase recovery apparatus may be separately designed based on the system performance, but is less than or equal to the quantity of times of exchanging the soft value information in the information iteration apparatus. In other words, after the turbo iteration in the information iteration apparatus stops, the information iteration apparatus does not feed back a corresponding feedback signal to the phase recovery apparatus. However, when iteration between the information iteration apparatus and the phase recovery apparatus stops or does not start, the corresponding turbo iteration may still be performed in the information iteration apparatus, and details are not described herein again in this embodiment.

Embodiment 3

Figure 6:
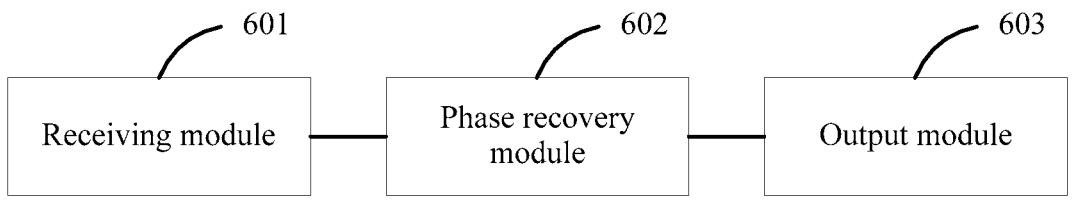
FIG. 6 is a schematic structural diagram of the phase recovery apparatus according to Embodiment 3 of the present invention.

Based on a same inventive concept, Embodiment 3 of the present invention provides a phase recovery apparatus. For a specific implementation of the phase recovery apparatus, refer to related descriptions in the foregoing method Embodiment 2 or system Embodiment 1. No repeated description is provided. Specifically, as shown in FIG. 6, FIG. 6 is a schematic structural diagram of the phase recovery apparatus according to Embodiment 3 of the present invention, and the apparatus includes:

a receiving module 601, configured to receive a signal output by an equalizer and a feedback signal fed back by an information iteration apparatus;

a phase recovery module 602, configured to perform, based on the feedback signal, phase recovery on the signal output by the equalizer; and an output module 603, configured to output a phase-recovered signal to a post filtering apparatus, so that the post filtering apparatus performs noise filtering on the phase-recovered signal, and outputs a noise-filtered signal to the information iteration apparatus, where the feedback signal is sequence detection information and/or error detection information that are/is obtained when the information iteration apparatus performs, in a soft value information iteration manner, sequence detection and error detection on the noise-filtered signal output by the post filtering apparatus.

To be specific, the phase recovery apparatus provided in this embodiment may perform, based on the feedback signal fed back by the information iteration apparatus, the phase recovery on the signal output by the equalizer, and output the phase-recovered signal to the post filtering apparatus, so that the post filtering apparatus performs the noise filtering on the phase-recovered signal, and outputs the noise-filtered signal to the information iteration apparatus. The feedback signal is the sequence detection information and/or the error detection information that are/is obtained when the information iteration apparatus performs, in the soft value information iteration manner, the sequence detection and the error detection on the noise-filtered signal output by the post filtering apparatus.

In other words, when soft value information is exchanged in the information iteration apparatus in a turbo iteration manner to improve system performance, the phase recovery apparatus provided in this embodiment may iterate the soft value information and/or hard decision information with the information iteration apparatus, so as to perform the phase recovery on the signal output by the equalizer. Output of the information iteration apparatus is more accurate in determining the signal. Therefore, precision of the phase recovery can be greatly improved, and cycle skipping is reduced, further, input signal quality of the post filtering apparatus can be improved, a problem that performance improvement of an entire system is limited because an existing turbo iteration manner is used to improve the system performance but cannot improve or cannot greatly improve the input signal quality of a post filter is resolved, and the system performance is improved.

Optionally, the phase recovery module 602 is specifically configured to: extract, based on the feedback signal received by the receiving module 601, a phase offset of the signal output by the equalizer, calculate an average value of the phase offset to obtain phase offset data, and perform, based on the phase offset data, the phase recovery on the signal output by the equalizer.

Further, it should be noted that, because at an initial stage, the receiving module 601 usually can receive only the signal output by the equalizer, and cannot receive the feedback signal fed back by the information iteration apparatus. Therefore, at the initial phase recovery stage, the phase recovery module 602 may be specifically configured to: perform predetermine processing on the signal output by the equalizer, to obtain predetermine data of the signal, calculate the phase offset based on the predetermine data, perform averaging processing on the phase offset to obtain the phase offset data, and perform, based on the phase offset data, the phase recovery on the signal output by the equalizer, so that the output module 603 outputs the phase-recovered signal to the post filtering apparatus, and then the post filtering apparatus performs the noise filtering on the phase-recovered signal output by the output module 603, and outputs the noise-filtered signal to the information iteration apparatus.

Then (to be specific, at a subsequent phase recovery stage), if the receiving module 601 receives the feedback signal fed back by the information iteration apparatus, the phase recovery module 602 may perform, based on the feedback signal, the phase recovery on the signal output by the equalizer, so as to implement signal iteration processing based on the phase recovery apparatus and the information iteration apparatus.

Certainly, it should be noted that, at the subsequent phase recovery stage, in addition to performing, based on the feedback signal, the phase recovery on the signal output by the equalizer, the phase recovery module 602 may reuse phase-recovered data in a previous cycle (in other words, there is no need to perform the phase recovery again for every iteration), and this is not limited in this embodiment.

Further, it should be noted that the sequence detection information is sequence detection soft value information and/or sequence detection hard decision information, and the error detection information is error detection soft value information and/or error detection hard decision information. The soft value information is information used to reflect a probability that sequence symbols in the signal are a specified symbol, and/or information used to reflect a ratio of probabilities that the sequence symbols in the signal are different specified symbols. The hard decision information is information used to reflect specific values of the sequence symbols in the signal.

Further, it should be noted that a quantity of times the information iteration apparatus feeds back the feedback signal to the phase recovery apparatus is not greater than a quantity of times of soft value information iteration performed by the information iteration apparatus.

To be specific, a quantity of times the information iteration apparatus feeds back the sequence detection information and/or the error detection information to the receiving module 601 may be separately designed based on the system performance, but is less than or equal to the quantity of times of exchanging the soft value information in the information iteration apparatus. In other words, after the turbo iteration in the information iteration apparatus stops, the information iteration apparatus does not feed back a corresponding feedback signal to the receiving module 601 of the phase recovery apparatus. However, when iteration between the information iteration apparatus and the phase recovery apparatus stops or does not start, the corresponding turbo iteration may still be performed in the information iteration apparatus, and details are not described herein again in this embodiment.

Figure 7:
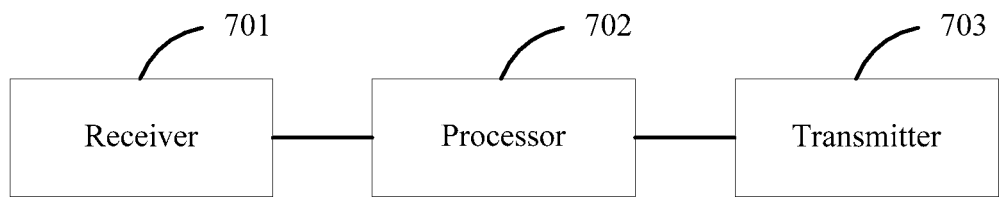
FIG. 7 is a schematic structural diagram of the another phase recovery apparatus according to Embodiment 3 of the present invention.

Further, based on the same inventive concept, Embodiment 3 of the present invention further provides another phase recovery apparatus, and the another phase recovery apparatus is a corresponding phase recovery entity device. For a specific implementation of the another phase recovery apparatus, refer to related descriptions in the foregoing method Embodiment 2 or system Embodiment 1. No repeated description is provided. Specifically, as shown in FIG. 7, the another phase recovery apparatus may include:

a receiver 701, configured to receive a signal output by an equalizer and a feedback signal fed back by an information iteration apparatus;

a processor 702, configured to perform, based on the feedback signal received by the receiver 701, phase recovery on the signal output by the equalizer; and a transmitter 703, configured to output a phase-recovered signal to a post filtering apparatus, so that the post filtering apparatus performs noise filtering on the phase-recovered signal, and outputs a noise-filtered signal to the information iteration apparatus, where the feedback signal is sequence detection information and/or error detection information that are/is obtained when the information iteration apparatus performs, in a soft value information iteration manner, sequence detection and error detection on the noise-filtered signal output by the post filtering apparatus.

Optionally, the processor 702 may be specifically configured to: extract, based on the received feedback signal, a phase offset of the signal output by the equalizer, calculate an average value of the phase offset to obtain phase offset data, and perform, based on the phase offset data, the phase recovery on the signal output by the equalizer.

It should be noted that the sequence detection information is sequence detection soft value information and/or sequence detection hard decision information, and the error detection information is error detection soft value information and/or error detection hard decision information. Soft value information is information used to reflect a probability that sequence symbols in the signal are a specified symbol, and/or information used to reflect a ratio of probabilities that the sequence symbols in the signal are different specified symbols, and hard decision information is information used to reflect specific values of the sequence symbols in the signal.

In addition, it should be noted that a quantity of times the information iteration apparatus feeds back the feedback signal to the phase recovery apparatus is not greater than a quantity of times of soft value information iteration performed by the information iteration apparatus.

In addition, it should be noted that the processor 702 may be a device or a circuit that has a corresponding data processing capability, for example, a Central Processing Unit (CPU), an micro control unit (MCU), or a digital signal processing (DSP), or a combination of the device and the circuit. The receiver 701 may be a corresponding signal input interface, or the like, and the transmitter 703 may be a corresponding signal output interface, or the like. Details are not described herein.

Persons skilled in the art should understand that the embodiments of the present invention may be provided as a method, an apparatus (device), or a computer program product. Therefore, the present invention may use a form of hardware only embodiments, software only embodiments, or embodiments with a combination of software and hardware. Moreover, the present invention may use a form of a computer program product that is implemented on one or more computer-usable storage media (including but not limited to a disk memory, a CD-ROM, an optical memory, and the like) that include computer-usable program code.

The present invention is described with reference to the flowcharts and/or block diagrams of the method, the apparatus (device), and the computer program product according to the embodiments of the present invention. It should be understood that computer program instructions may be used to implement each process and/or each block in the flowcharts and/or the block diagrams and a combination of a process and/or a block in the flowcharts and/or the block diagrams. These computer program instructions may be provided for a general-purpose computer, a dedicated computer, an embedded processor, or a processor of any other programmable data processing device to generate a machine, so that the instructions executed by a computer or a processor of any other programmable data processing device generate an apparatus for implementing a specific function in one or more processes in the flowcharts and/or in one or more blocks in the block diagrams.

These computer program instructions may also be stored in a computer-readable memory that can instruct the computer or any other programmable data processing device to work in a specific manner, so that the instructions stored in the computer-readable memory generate an artifact that includes an instruction apparatus. The instruction apparatus implements a specific function in one or more processes in the flowcharts and/or in one or more blocks in the block diagrams.

These computer program instructions may also be loaded onto a computer or another programmable data processing device, so that a series of operations and steps are performed on the computer or the another programmable device, thereby generating computer-implemented processing. Therefore, the instructions executed on the computer or the another programmable device provide steps for implementing a specific function in one or more processes in the flowcharts and/or in one or more blocks in the block diagrams.

Although some preferred embodiments of the present invention have been described, persons skilled in the art can make changes and modifications to these embodiments once they learn the basic inventive concept. Therefore, the appended claims are intended to be construed as to cover the preferred embodiments and all changes and modifications falling within the scope of the present invention.

Obviously, persons skilled in the art can make various modifications and variations to the present invention without departing from the spirit and scope of the present invention. The present invention is intended to cover these modifications and variations provided that they fall within the scope of protection defined by the appended claims and their equivalent technologies.

What is claimed is:

1. A signal processing system, comprising:
a phase recovery circuit configured to:
receive, from an equalizer, a signal output by the equalizer;
receive, from an information iteration circuit, a feedback signal;
perform, by the phase recovery circuit and based on the feedback signal, phase recovery on the signal output by the equalizer; and
output a phase-recovered signal to a post filtering circuit;
the post filtering circuit configured to:
perform noise filtering on the phase-recovered signal output by the phase recovery circuit; and
output a noise-filtered signal to the information iteration circuit; and
the information iteration circuit configured to:
perform, in a soft value information iteration manner, sequence detection and error detection on the noise-filtered signal output by the post filtering circuit, to recover an original signal;
use, as the feedback signal, sequence detection information obtained by the sequence detection or error detection information obtained by the error detection; and
feed back the feedback signal to the phase recovery circuit.

2. The system according to claim 1, wherein the phase recovery circuit is configured to:
extract, based on the received feedback signal, a phase offset of the signal output by the equalizer;
calculate an average value of the phase offset to obtain phase offset data; and
perform, based on the phase offset data, the phase recovery on the signal output by the equalizer.

3. The system according to claim 1, wherein:
the sequence detection information is at least one of sequence detection soft value information or sequence detection hard decision information; and
the error detection information is at least one of error detection soft value information or error detection hard decision information, wherein
soft value information is at least one of information reflecting a probability that sequence symbols in the signal are a specified symbol, or information reflecting a ratio of probabilities that the sequence symbols in the signal are different specified symbols, and hard decision information is information reflecting specific values of the sequence symbols in the signal.

4. The system according to claim 3, wherein
the information iteration circuit comprises a sequence detection circuit and a forward error correction circuit;
the sequence detection circuit is configured to:
receive the error detection soft value information fed back by the forward error correction circuit;
perform, based on the error detection soft value information, the sequence detection on the noise-filtered signal output by the post filtering circuit;
output the sequence detection soft value information to the forward error correction circuit;
use, as the feedback signal, the sequence detection soft value information or the sequence detection hard decision information that is obtained when the sequence detection is performed on the noise-filtered signal output by the post filtering circuit; and
feed back the feedback signal to the phase recovery circuit; and
the forward error correction circuit is configured to:
perform error detection on the sequence detection soft value information output by the sequence detection circuit, to recover the original signal; and
feed back the error detection soft value information to the sequence detection circuit.

5. The system according to claim 3, wherein
the information iteration circuit comprises a sequence detection circuit and a forward error correction circuit;
the sequence detection circuit is configured to:
receive the error detection soft value information fed back by the forward error correction circuit;
perform, based on the error detection soft value information, the sequence detection on the noise-filtered signal output by the post filtering circuit; and
output the sequence detection soft value information to the forward error correction circuit; and
the forward error correction circuit is configured to:
perform error detection on the sequence detection soft value information output by the sequence detection circuit, to recover the original signal;
feed back the error detection soft value information to the sequence detection circuit;
use, as the feedback signal, the error detection soft value information or the error detection hard decision information that is obtained when the error detection is performed on the sequence detection soft value information output by the sequence detection circuit; and
feed back the feedback signal to the phase recovery circuit.

6. The system according to claim 3, wherein
the information iteration circuit comprises a sequence detection circuit and a forward error correction circuit;
the sequence detection circuit is configured to:
receive the error detection soft value information fed back by the forward error correction circuit;
perform, based on the error detection soft value information, the sequence detection on the noise-filtered signal output by the post filtering circuit;
output the sequence detection soft value information to the forward error correction circuit;
use, as the feedback signal, the sequence detection soft value information or the sequence detection hard decision information that is obtained when the sequence detection is performed on the noise-filtered signal output by the post filtering circuit; and
feed back the feedback signal to the phase recovery circuit; and
the forward error correction circuit is configured to:
perform error detection on the sequence detection soft value information output by the sequence detection circuit, to recover the original signal;
feed back the error detection soft value information to the sequence detection circuit;

use, as the feedback signal, the error detection soft value information or the error detection hard decision information that is obtained when the error detection is performed on the sequence detection soft value information output by the sequence detection circuit; and feed back the feedback signal to the phase recovery circuit.

7. The system according to claim 1, wherein:
a quantity of times the information iteration circuit feeds back the feedback signal to the phase recovery circuit is not greater than a quantity of times of soft value information iteration performed by the information iteration circuit.

8. A signal processing method, comprising:
receiving, by a phase recovery circuit and from an equalizer, a signal output by the equalizer;
receive, by the phase recovery circuit and from an information iteration circuit, a feedback signal;
performing, by the phase recovery circuit and based on the feedback signal, phase recovery on the signal output by the equalizer; and
outputting a phase-recovered signal to a post filtering circuit, wherein the post filtering circuit performs noise filtering on the phase-recovered signal and outputs a noise-filtered signal to the information iteration circuit, wherein
the feedback signal is sequence detection information or error detection information that is obtained when the information iteration circuit performs, in a soft value information iteration manner, sequence detection and error detection on the noise-filtered signal output by the post filtering circuit.

9. The method according to claim 8, wherein the performing, based on the feedback signal, phase recovery on the signal output by the equalizer comprises:
extracting, based on the received feedback signal, a phase offset of the signal output by the equalizer;
calculating an average value of the phase offset to obtain phase offset data; and
performing, based on the phase offset data, the phase recovery on the signal output by the equalizer.

10. The method according to claim 8, wherein:
the sequence detection information is at least one of sequence detection soft value information or sequence detection hard decision information; and
the error detection information is at least one of error detection soft value information or error detection hard decision information, wherein
soft value information is information reflecting a probability that sequence symbols in the signal are a specified symbol, or information reflecting a ratio of probabilities that the sequence symbols in the signal are different specified symbols, and hard decision information is information reflecting specific values of the sequence symbols in the signal.

11. The method according to claim 8, wherein a quantity of times the information iteration circuit feeds back the feedback signal to the phase recovery circuit is not greater than a quantity of times of soft value information iteration performed by the information iteration circuit.

12. A phase recovery apparatus, comprising:
a receiver configured to:
receive, from an equalizer, a signal output by the equalizer; and
receive, from an information iteration circuit, a feedback signal;
a phase recovery circuit configured to perform, based on the feedback signal, phase recovery on the signal output by the equalizer; and
an output circuit configured to output a phase-recovered signal to a post filtering circuit, wherein the post filtering circuit performs noise filtering on the phase-recovered signal, and outputs a noise-filtered signal to the information iteration circuit, wherein
the feedback signal is sequence detection information or error detection information that is obtained when the information iteration circuit performs, in a soft value information iteration manner, sequence detection and error detection on the noise-filtered signal output by the post filtering circuit.

13. The apparatus according to claim 12, wherein the phase recovery circuit is configured to:
extract, based on the received feedback signal, a phase offset of the signal output by the equalizer;
calculate an average value of the phase offset to obtain phase offset data; and
perform, based on the phase offset data, the phase recovery on the signal output by the equalizer.

14. The apparatus according to claim 12, wherein:
the sequence detection information is sequence detection soft value information or sequence detection hard decision information; and
the error detection information is error detection soft value information or error detection hard decision information, wherein
soft value information is information reflecting a probability that sequence symbols in the signal are a specified symbol, or information reflecting a ratio of probabilities that the sequence symbols in the signal are different specified symbols, and hard decision information is information reflecting specific values of the sequence symbols in the signal.

15. The apparatus according to claim 12, wherein:
a quantity of times the information iteration circuit feeds back the feedback signal to the phase recovery circuit is not greater than a quantity of times of soft value information iteration performed by the information iteration circuit.

* * * * *